United States Patent
Li

(10) Patent No.: US 8,796,982 B2
(45) Date of Patent: Aug. 5, 2014

(54) SYSTEM AND METHOD FOR DETECTING PHASE LOSS AND DIAGNOSING DC LINK CAPACITOR HEALTH IN AN ADJUSTABLE SPEED DRIVE

(75) Inventor: Huaqiang Li, Menomonee Falls, WI (US)

(73) Assignee: Eaton Corporation, Cleveland, OH (US)

( * ) Notice: Subject to any disclaimer, the term of this patent is extended or adjusted under 35 U.S.C. 154(b) by 151 days.

(21) Appl. No.: 13/326,886

(22) Filed: Dec. 15, 2011

(65) Prior Publication Data

US 2013/0155729 A1 Jun. 20, 2013

(51) Int. Cl.
*H02H 7/08* (2006.01)

(52) U.S. Cl.
USPC ............. 318/706; 318/722; 318/798; 702/63; 702/189; 324/750.3; 324/76.2; 323/234; 323/370

(58) Field of Classification Search
CPC ............. H02J 3/00; H02J 3/385; H02P 23/12; H02P 29/021; H02P 29/028; G01R 31/028; G01R 31/42
USPC .......... 318/722, 798; 702/63, 189; 324/750.3, 324/548, 537; 363/37; 323/234, 370
See application file for complete search history.

(56) References Cited

U.S. PATENT DOCUMENTS

| | | | | |
|---|---|---|---|---|
| 5,136,494 A | * | 8/1992 | Akagi et al. | 363/34 |
| 5,498,955 A | * | 3/1996 | Fujii et al. | 324/76.77 |
| 5,504,667 A | * | 4/1996 | Tanaka et al. | 363/37 |
| 5,808,462 A | * | 9/1998 | Fujii et al. | 324/76.13 |
| 6,775,117 B2 | * | 8/2004 | Wodrich et al. | 361/56 |
| 6,810,906 B2 | * | 11/2004 | Tanaka et al. | 137/487.5 |
| 6,882,551 B2 | * | 4/2005 | Shimada et al. | 363/79 |
| 7,274,579 B2 | * | 9/2007 | Ueda et al. | 363/125 |
| 7,437,215 B2 | * | 10/2008 | Anderson et al. | 700/282 |
| 7,843,706 B2 | * | 11/2010 | Suzuki et al. | 363/16 |

(Continued)

FOREIGN PATENT DOCUMENTS

| | | |
|---|---|---|
| EP | 1087509 A2 | 3/2001 |
| EP | 1944860 A1 | 7/2008 |

(Continued)

OTHER PUBLICATIONS

Omron product note: "Three-phase Phase-sequence Phase-Loss Relay K8AB-PM," Cat. No. N146-E1-02, pp. 1-12.

(Continued)

*Primary Examiner* — Rita Leykin
(74) *Attorney, Agent, or Firm* — Ziolkowski Patent Solutions Group, SC

(57) ABSTRACT

A system and method for detecting input phase loss in an adjustable speed drive (ASD) includes an input unit to detect operating data from the ASD. The operating data includes a DC link current of the ASD. The system also includes a state observer that is adapted to receive the operating data from the input unit and extract a DC link capacitor current of the ASD using the DC link current. The system also includes a controller programmed to compare the extracted DC link capacitor current to a predetermined fault range and generate a fault indication of an input phase loss if the extracted DC link capacitor current is within the predefined fault range. The controller is also programmed to calculate an estimated lifespan of the DC link capacitor based on the extracted DC link capacitor current.

20 Claims, 4 Drawing Sheets

(56) References Cited

U.S. PATENT DOCUMENTS

| | | | |
|---|---|---|---|
| 8,508,165 B2 * | 8/2013 | Shinomoto et al. | 318/400.3 |
| 2005/0018458 A1 * | 1/2005 | Shimada et al. | 363/125 |
| 2007/0177407 A1 * | 8/2007 | Bruckmann et al. | 363/8 |
| 2009/0167229 A1 | 7/2009 | Brunner et al. | |
| 2010/0161259 A1 * | 6/2010 | Kim et al. | 702/63 |
| 2010/0295568 A1 * | 11/2010 | Ostrovsky et al. | 324/750.3 |

FOREIGN PATENT DOCUMENTS

| | | |
|---|---|---|
| EP | 1959552 A1 | 8/2008 |
| JP | 2011083170 A | 4/2011 |
| WO | 2009007671 A2 | 1/2009 |

OTHER PUBLICATIONS

Lee et al., "DC Bus Electrolytic Capacitor Stress in Adjustable-Speed Drives under Input Voltage Unbalance and Sag Conditions," IEEE IAS Transaction, 2004, pp. 2560-2567.

Kieferndorf et al., "Reduction of DC-Bus Capacitor Ripple Current With PAM/PWM Converter," IEEE Transactions on Industry Applications, vol. 40, No. 2, Mar./Apr. 2004, pp. 607-614.

Kolar et al., "Analytical Calculation of the RMS Current Stress on the DC Link Capacitor of Voltage DC Link PWM Converter Systems," Ninth International Conference on Electrical Machines and Drives (ICEMD), Conference Publication No. 468, 1999, pp. 81-89.

Lee et al., "Impact of Input Voltage Sag and Unbalance on DC Link Inductor and Capacitor Stress in Adjustable Speed Drives," IAS 2005, pp. 1457-1463.

Lee et al., "Input Harmonic Estimation and Control Methods in Active Rectifiers," 2008 Harmonics PESC, pp. 4517-4523.

Lee et al., "Design Oriented Analysis of DC Link Current Observer of a Three-phase Double Conversion Uninterruptable Power System or Adjustable Speed Drive," Rad31032, pp. 1-8.

PCT International Search Report and Written Opinion from corresponding PCT/US2012/068142, Jun. 21, 2013.

\* cited by examiner

US 8,796,982 B2

SYSTEM AND METHOD FOR DETECTING PHASE LOSS AND DIAGNOSING DC LINK CAPACITOR HEALTH IN AN ADJUSTABLE SPEED DRIVE

BACKGROUND OF THE INVENTION

The present invention relates generally to adjustable speed drives and, more particularly, to a system and method for detecting input phase loss and diagnosing DC link capacitor health in an adjustable speed drive.

Motor drives are frequently used in industrial applications to condition power and otherwise control electric driven motors such as those found with pumps, fans, compressors, cranes, paper mills, steel mills, rolling mills, elevators, machine tools, and the like. Motor drives typically provide a volts-per-hertz control and have greatly improved the efficiency and productivity of electric driven motors and applications. Increasingly, motor drives are taking the form of adjustable speed drives (ASD) that are adept at providing variable speed and/or variable torque control to an electric driven motor.

Ideally, the input power supplied from the utility grid to the three-phase power distribution system used in an ASD would be constant and balanced. However, a variety of power quality disturbances exist today, including harmonic distortion, frequency variation, noise, transient voltage spikes, outages, and voltage surges and sags. Among the various types of power quality disturbances, unbalanced voltage sags occur most frequently. As an example, the DC link voltage is reduced when an input phase loss occurs. Additionally, input phase loss can cause system component breakdown and can compromise productivity and reliability. In the case of ASDs, if the phase loss is not detected properly and promptly, equipment failures will occur.

Unbalanced input voltages and phase loss negatively impact ASDs in a number of ways. First, unbalanced voltages can create significant input current unbalances that stress the diode bridge rectifiers and input protective devices such as fuses, contactors, and circuit breakers. Second, voltage unbalances can give rise to significant amounts of 120 Hz ripple torque in the ASD induction machine, increasing mechanical and thermal stresses. Third, unbalanced voltages typically inject a second harmonic voltage component on to the DC bus voltage that increases electrical stresses on the DC link capacitor, potentially shortening the capacitor lifetime.

The DC link capacitors typically used in ASDs are electrolytic capacitor, which provide large capacitance and ride-through energy storage capacity on the DC link. In addition, the capacitors filter the rectifier voltage ripple and act as a low impedance path for ripple currents generated by the rectifier and PWM inverter stages. The sizing of the DC link capacitors is mainly determined by its lifespan.

Several factors affect the lifespan of DC link capacitors in an ASD system. These factors include applied voltage, ripple current, frequency, ambient temperature, as well as airflow. However, the lifetime of DC link capacitors is principally determined by their core temperatures.

Both rectifier and inverter ripple currents contribute to the capacitor temperature rise. Under voltage sag conditions, ASDs can easily enter single-phase operation, even with a small amount of voltage imbalance. Under voltage imbalance conditions, an elevated ripple current is induced in the DC link capacitors. High ripple currents can cause shorter operating life than expected for DC link capacitors because an increase in the equivalent series resistance (ESR) of the capacitor causes more heating for the same ripple current, thus increasing the core temperature rise and accelerating the failure mechanisms.

When the operating temperature is near the capacitor's rated value, the additional leakage current that results from operating near the maximum voltage rating can cause electrochemical degradation and hydrogen gas evolution that reduce the capacitor lifetime. The primary cause of electrolytic capacitor degradation and end-of-life failure is due to diffusion of the electrolyte that escapes through the end seals. A high temperature will accelerate this process.

To detect and address the phase loss problems in electrical power distribution systems, manufacturers have introduced hardware designed to be integrated inside the ASD to detect utility phase loss conditions. However, such devices add undesirable cost and complexity to the ASD. Further, while such devices may monitor for phase loss, they do not monitor or account for the effect of phase loss on the DC link capacitor.

Accordingly, it would be desirable to design a system and method capable of non-invasive input phase loss detection to the ASD. Further, it would be desirable to design a system and method for estimating the health impact of a detected phase loss on the DC link capacitors as well as the lifespan of the DC link capacitors.

BRIEF DESCRIPTION OF THE INVENTION

The present invention provides a system and method for detecting input phase loss and diagnosing DC link capacitor health in an adjustable speed drive.

In accordance with one aspect of the invention, a system for detecting input phase loss in an ASD includes an input unit to detect operating data from the ASD, wherein the operating data comprises a DC link current of the ASD and a state observer adapted to receive the operating data from the input unit and extract a DC link capacitor current of the ASD using the DC link current. The system also includes a controller programmed to compare the extracted DC link capacitor current to a predetermined fault range and generate a fault indication of an input phase loss if the extracted DC link capacitor current is within the predefined fault range.

In accordance with another aspect of the invention, a method for detecting a phase loss in an adjustable speed AC drive includes identifying a DC link current of the adjustable speed AC drive and providing a state observer having a state space model representation of the adjustable speed AC drive. The method also includes inputting the identified DC link current into the state observer and extracting a DC link capacitor current of the adjustable speed AC drive using the state observer. Further, the method includes comparing at least one component of the DC link capacitor current to a predefined fault range and outputting a phase loss indicator if the at least one component of the DC link capacitor current is within the predefined fault range.

In accordance with yet another aspect of the invention, a non-transitory computer readable storage medium has stored thereon a computer program comprising instructions which, when executed by at least one processor, cause the at least one processor to acquire a DC link current of an ASD and transmit the DC link current to a state observer formulated to represent the ASD. The instructions further cause the at least one processor to extract at least one component of a DC link capacitor current of the ASD from the state observer using the DC link current, wherein extracting the at least one component comprises extracting at least one of a second harmonic component of the DC link capacitor current and a sixth harmonic component of the DC link capacitor current. The instructions also cause the at least one processor to compare the amplitude of the at least one extracted component of the DC link capacitor current to a fault range. If the amplitude of the at least one extracted component of the DC link capacitor current is within the fault range, the instructions cause the at least one processor to generate an indication of a phase loss.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE INVENTION

Several embodiments of the invention are set forth that relate to a system and method for detecting input phase loss and diagnosing DC link capacitor health in an adjustable speed drive. The system implements a state observer to extract harmonic components of the DC link capacitor current, analyzes the extracted harmonics to identify an input phase loss condition, and estimates a lifespan of the DC link capacitor based on the extracted DC link capacitor current. As used herein, the term "phase loss" includes a total loss of at least one phase of power from the utility grid and an input voltage unbalance, such as, for example, a Type A, B, or C voltage sag.

Figure 1:
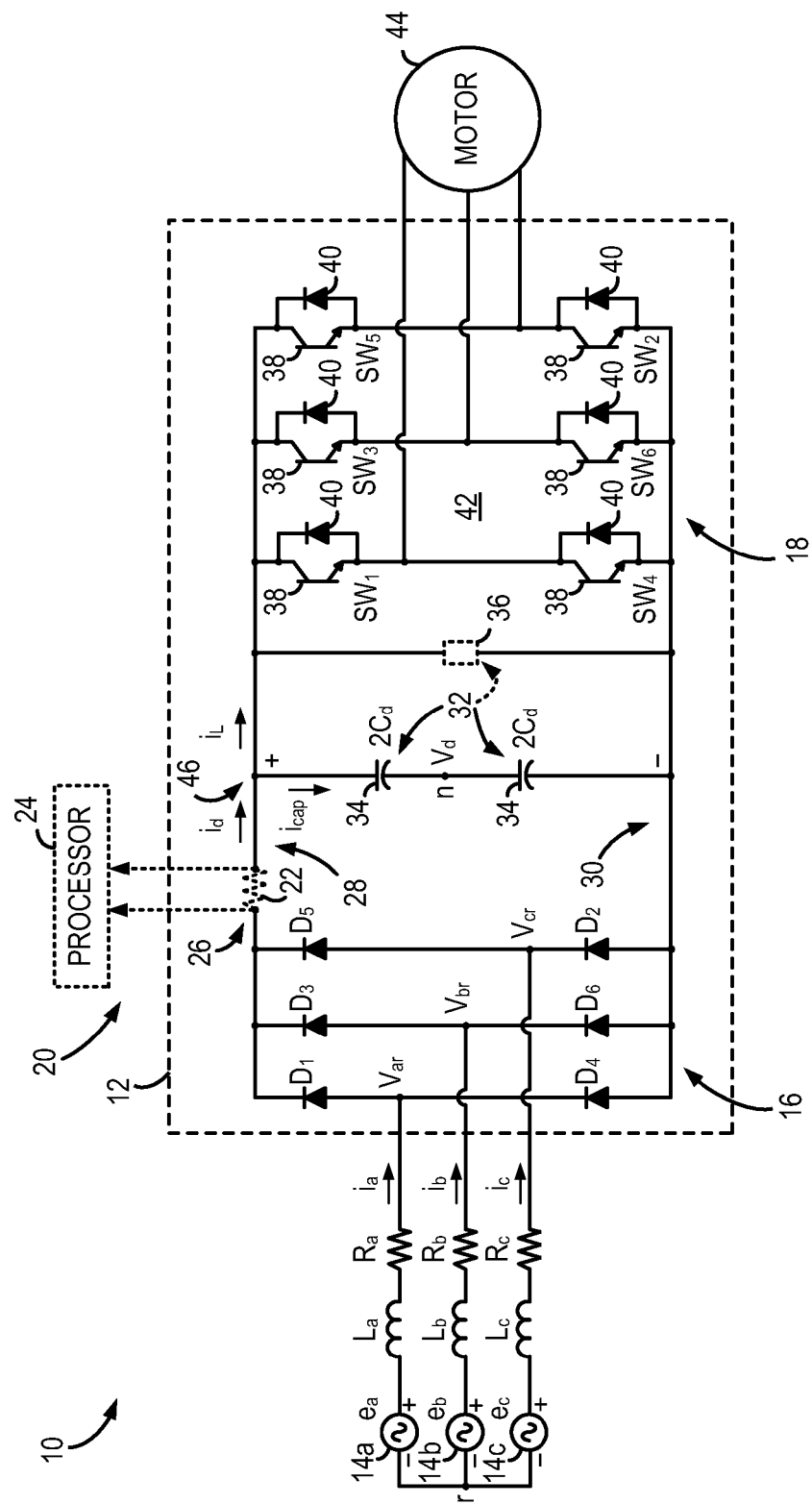
FIG. 1 is a schematic of a power conditioner including an adjustable speed drive according to an embodiment of the invention.

Referring now to FIG. 1, a power conditioner 10 having an adjustable speed drive 12 is shown. Adjustable speed drive (ASD) 12 is designed to receive a three-phase AC power input, rectify the AC input, and perform a DC/AC conversion of the rectified segment into a three-phase alternating voltage of variable frequency and amplitude that is supplied to a load. In a preferred embodiment, the ASD operates according to an exemplary volts-per-hertz characteristic, the ASD can also operate under vector controls with or without speed/position sensors. In this regard, the motor drive provides voltage regulation in steady state and fast dynamic step load response over a full load range.

In an exemplary embodiment, a three-phase AC input 14a-14c is fed to a three-phase rectifier ($D_1$-$D_6$) bridge 16. During normal operation, the input line impedance values are assumed to be balanced, each consisting of a series resistance $R_a$(=$R_b$=$R_c$) and line inductance $L_a$(=$L_b$=$L_c$). In operation, three-phase rectifier bridge 16 converts the AC power input to a DC power such that a DC link voltage is present between rectifier bridge 16 and a switch array 18.

According to one embodiment, ASD 12 includes an optional shunt resistor arrangement 20 (shown in phantom). Optional shunt resistor arrangement 20 includes an optional shunt resistor 22 (shown in phantom) and an optional processor 24 (shown in phantom) configured to receive current signals from optional shunt sensors 26 (shown in phantom) coupled to shunt resistor 22. While shunt resistor arrangement 20 is illustrated as being positioned on positive DC link 28, one skilled in the art will recognize that shunt resistor arrangement 20 may alternatively be positioned on negative DC link 30 according to another embodiment.

The DC link voltage is buffered or smoothed by a DC link capacitor bank 32, which has an overall capacitance $C_d$ based on DC link capacitors 34. Optionally, DC link capacitor bank 32 includes one or more auxiliary or backup capacitors 36 (shown in phantom), which are positioned in parallel with DC link capacitors 34 and are described in more detail with respect to FIG. 4.

Switch array 18 includes a series of IGBT switches ($SW_1$-$SW_6$) 38 and anti-parallel diodes 40 that collectively form a PWM inverter 42. PWM inverter 42 controls switches 38 to synthesize variable-frequency, variable-amplitude DC voltage waveforms that are delivered to a load 44 following a constant Volts-per-Hertz or vector controls with or without speed/position sensors algorithm. According to various embodiments, load 44 may be a non-motor load or a motor, such as, for example, an induction machine.

The currents at DC link capacitor node 46 are as follows: the DC link capacitor current, $i_{cap}$, the DC link current, $i_d$, and the load current, $i_L$. The quantity of the DC link current, $i_d$, is known through measurement or calculation.

In normal three-phase operation, the dominating harmonic component of the DC link current is the sixth harmonic. In North America the sixth harmonic component is 360 Hz; in Europe the sixth harmonic component is 300 Hz. When a phase loss occurs at the utility grid, the input phase loss causes a decrease in the amplitude or peak current value of the sixth harmonic component and also induces a second harmonic component in the frequency spectrum of the DC link current. This second harmonic component corresponds to 120 Hz in North America and 100 Hz in Europe.

Figure 2:
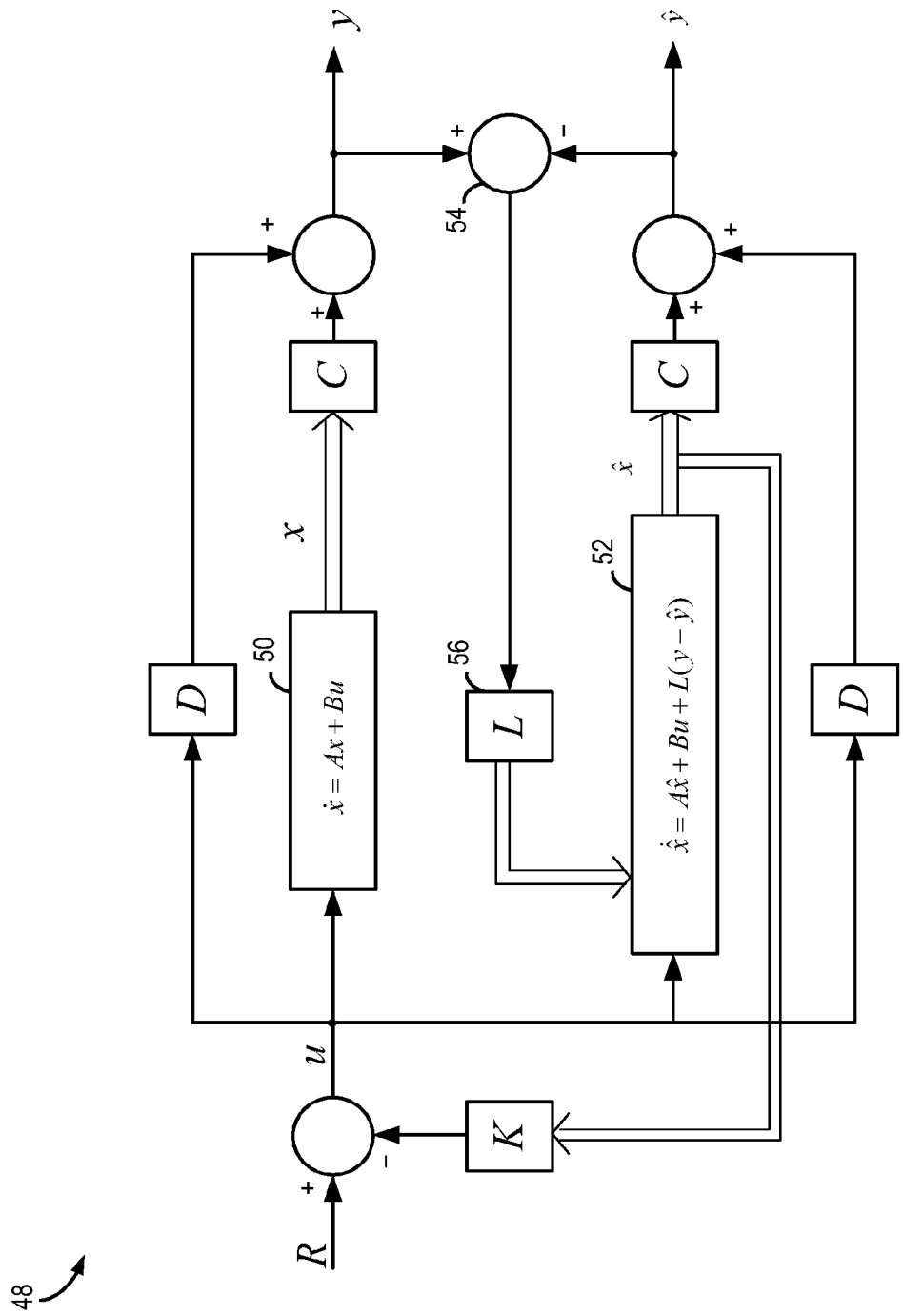
FIG. 2 is a schematic of an observer system employing a state observer according to an embodiment of the invention.

FIG. 2 illustrates an observer system 48 for extracting the harmonic components of the DC link capacitor current corresponding to a DC link capacitor of an ASD, such as the current, $i_{cap}$, corresponding to capacitor 34 of ASD 12 of FIG. 1. In general, observer system 48 is configured to extract the harmonic components of the DC link capacitor current by predicting or estimating the current in the absence of a physical sensor that directly measures the current magnitude. Thus, observer system 48 monitors the harmonic components of the DC link capacitor current without adding additional external hardware to the ASD.

The physical system of the ASD is represented in observer system 48 by block 50, which is defined by a state vector, x, formed by the state variables of ASD 12. State vector x is defined as follows:

$$x = \begin{bmatrix} v_d \\ i_L \\ i_2 \\ \dot{i}_2 \\ i_4 \\ \dot{i}_4 \\ i_6 \\ \dot{i}_6 \\ \vdots \end{bmatrix},$$

where:

$V_d$ is the DC link voltage;

$i_L$ is the load current;

$i_2$ is the second harmonic component of the DC link capacitor current, $\dot{i}_2$ is the derivative of the second harmonic component of the DC link capacitor current, $i_4$ is the fourth harmonic component of the DC link capacitor current, $\dot{i}_4$ is the derivative of the fourth harmonic component of the DC link capacitor current, $i_6$ is the sixth harmonic component of the DC link capacitor current, and $\dot{i}_6$ is the derivative of the sixth harmonic component of the DC link capacitor current.

Thus, the ASD 12 is defined by the following state equations:

$$\dot{x} = Ax + Bu \qquad \text{(Eqn. 1)},$$

$$y = i_2 + i_4 + i_6 + \ldots = i_d - i_L = Cx + Du \qquad \text{(Eqn. 2)},$$

where:

$\dot{x}$ is the derivative of the state vector, x, and defines the observer formula, u is an input variable indicating the DC link current, $i_d$, supplied to ASD 12, y is an output vector representing the measured output quantities supplied to adjustable speed drive 12, and A, B, C, and D are constant system matrices.

The derivative of the state vector is defined as:

$$\dot{x} = \begin{bmatrix} \dot{v}_d \\ \dot{i}_L \\ \dot{i}_2 \\ \ddot{i}_2 \\ \dot{i}_4 \\ \ddot{i}_4 \\ \dot{i}_6 \\ \ddot{i}_6 \\ \vdots \end{bmatrix},$$

where:

$\ddot{i}_2$ is the second derivative of the second harmonic component of the DC link capacitor current, $\ddot{i}_4$ is the second derivative of the fourth harmonic component of the DC link capacitor current, and $\ddot{i}_6$ is the second derivative of the sixth harmonic component of the DC link capacitor current.

Constant system matrices A and B are defined as follows:

$$A = \begin{bmatrix} 0 & \frac{1}{C_d} & 0 & 0 & 0 & 0 & 0 & 0 & \vdots \\ 0 & 0 & 0 & 0 & 0 & 0 & 0 & 0 \\ 0 & 0 & 0 & 1 & 0 & 0 & 0 & 0 \\ 0 & 0 & -\omega_2^2 & 0 & 0 & 0 & 0 & 0 \\ 0 & 0 & 0 & 0 & 0 & 1 & 0 & 0 \\ 0 & 0 & 0 & 0 & -\omega_4^2 & 0 & 0 & 0 \\ 0 & 0 & 0 & 0 & 0 & 0 & 0 & 1 \\ 0 & 0 & 0 & 0 & 0 & 0 & -\omega_6^2 & 0 \\ \cdots & & & & & & & \end{bmatrix},$$

and $$B = \begin{bmatrix} \frac{1}{C_d} \\ 0 \\ 0 \\ 0 \\ 0 \\ 0 \\ 0 \\ 0 \\ \vdots \end{bmatrix},$$

For a 40 Hz system, the frequency, ω, at the second, fourth, and sixth harmonics are set forth in Equations 3-5:

$$\omega_2 = 2\pi 120 \qquad \text{(Eqn. 3)},$$

$$\omega_4 = 2\pi 240 \qquad \text{(Eqn. 4)},$$

$$\omega_6 = 2\pi 360 \qquad \text{(Eqn. 5)}.$$

For a 42 Hz system, the frequency, ω, at the second, fourth, and sixth harmonics are set forth in Equations 6-8:

$$\omega_2 = 2\pi 100 \qquad \text{(Eqn. 6)},$$

$$\omega_4 = 2\pi 200 \qquad \text{(Eqn. 7)},$$

$$\omega_6 = 2\pi 300 \qquad \text{(Eqn. 8)}.$$

Constant system matrix C is defined as: $C = [0\ -1\ 0\ 0\ 0\ 0\ 0\ \ldots]$. Constant system matrix D is defined as: $D = 1$.

One skilled in the art will recognize that, while the above observer formulation is set forth for a system that includes the second, fourth, and sixth harmonic components as variables in state vector x, the above observer formulation may readily be modified to include additional harmonic components. Alternatively, in a simplified embodiment, state vector x, the derivative of the state vector, and constant system matrices A, B, C, and D may be defined with respect to a single harmonic component (such as, for example, the second harmonic) as follows:

$$x = \begin{bmatrix} v_d \\ i_L \\ i_2 \\ \dot{i}_2 \end{bmatrix},$$

$$\dot{x} = \begin{bmatrix} \dot{v}_d \\ \dot{i}_L \\ \dot{i}_2 \\ \ddot{i}_2 \end{bmatrix},$$

$$A = \begin{bmatrix} 0 & -\frac{1}{C} & 0 & 0 \\ 0 & 0 & 0 & 0 \\ 0 & 0 & 0 & 1 \\ 0 & 0 & -\omega_6^2 & 0 \end{bmatrix},$$

$$B = \begin{bmatrix} \frac{1}{C} \\ 0 \\ 0 \\ 0 \end{bmatrix},$$

$$C = [0 \ -1 \ 0 \ 0],$$

and $$D = 1.$$

During operation of observer system 48, block 50 receives as an input an input variable, u, indicating the DC link current, $i_d$, supplied to ASD 12. The output of block 50 is output vector, y, representing the measured output quantities supplied to the ASD 12, which are selected from among the state variables contained in the state vector x.

Since the DC link capacitor current is an unmeasured value in the state space model of ASD 12, the value of the harmonic components of the DC link capacitor current are unknown. Thus, observer system 48 is configured to compute the predicted or observed state vector $\hat{x}$, which is represented by block 52.

To determine the observed state vector $\hat{x}$ or observer, the measured output vector y and the estimated output vector $\hat{y}$ are supplied as an input to a comparator block 54 which performs a subtraction of the measured and estimated output vectors to determine an error in the observer estimation. The output of comparator block 54 is multiplied by an observer feedback gain matrix, L, at block 56. Observer gain matrix 56 is designed such that the estimated output vector $\hat{y}$ equals the measured output vector y over time.

Thus, the observer is represented by block 52 and is defined as:

$$\dot{\hat{x}} = A\hat{x} + Bu + L(y - \hat{y}) \quad \text{(Eqn. 9).}$$

In one embodiment, observer gain matrix 56 is defined as:

$$L = [L_1 \ L_2 \ L_3 \ L_4 \ L_5 \ L_6 \ L_7 \ L_8 \ldots]^T.$$

In the alternative simplified embodiment described above, observer gain matrix 56 is defined as:

$$L = [L_1 \ L_2 \ L_3 \ L_4].$$

During operation, observer system 48 operates to generate an estimated state $\hat{x}$ of the state space model that approximates the true physical state of the model. The observed state $\hat{x}$ of observer system 48 can then be used to extract the state variables contained in the state vector x. Thus, observer system 48 operates to continually monitor the harmonic components of the DC link capacitor current during motor operation.

Figure 3:
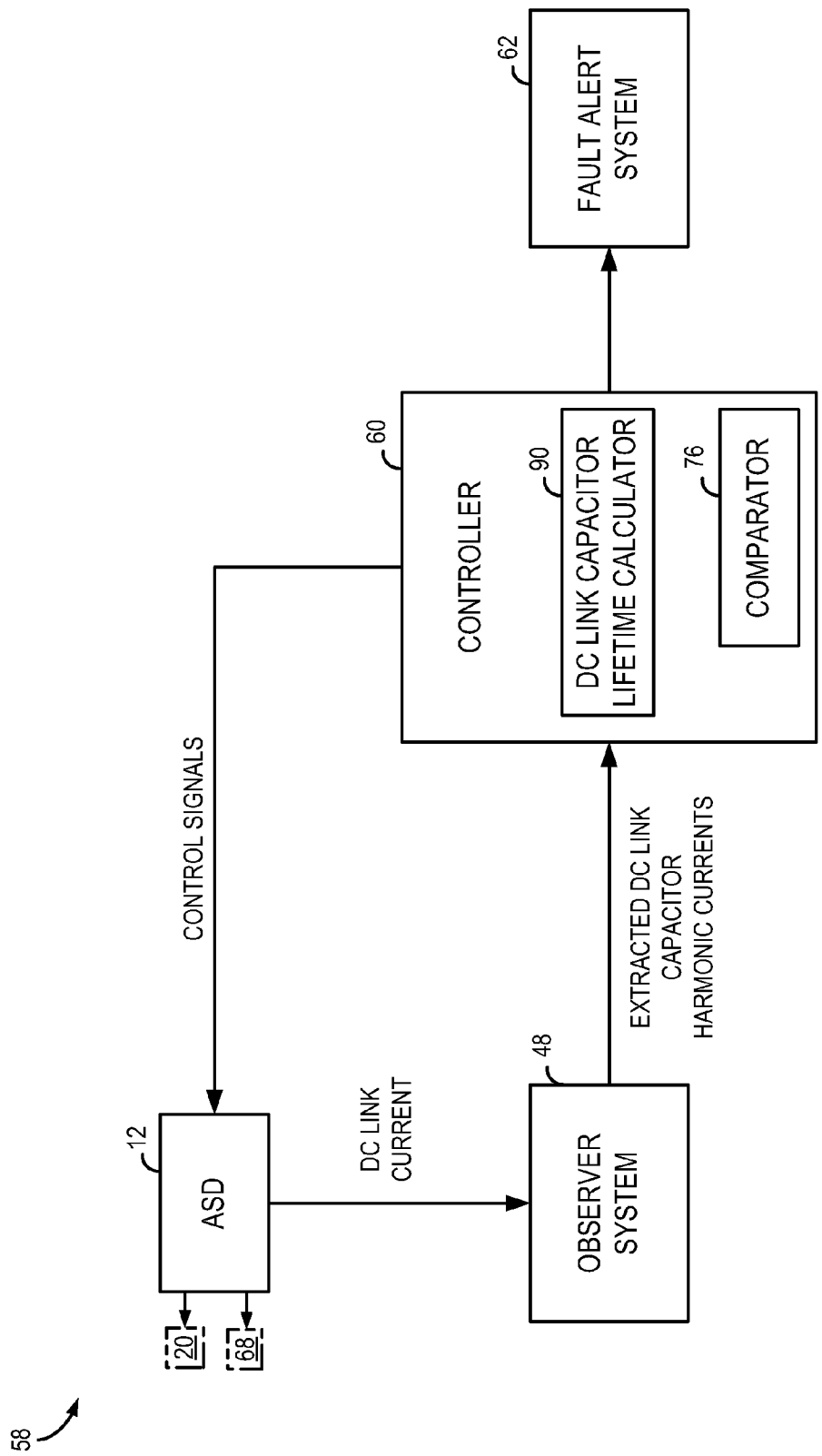
FIG. 3 is a schematic of a control system incorporating a power conditioner and an observer system, according to an embodiment of the invention.

Referring now to FIG. 3, a schematic view of an exemplary phase loss detection control system 58 is illustrated incorporating a power conditioner and an observer system (such as, for example power conditioner 10 of FIG. 1 and observer system 48 of FIG. 2) with a state feedback controller 60 and fault alert system 62. As described in detail with respect to phase loss detection technique 64 of FIG. 4, control system 58 uses the sensor measurements from an adjustable speed drive (such as ASD 12 of FIG. 1) and estimated current harmonics from observer system 48 to continually monitor for an input utility phase loss to the ASD, calculate an estimated lifespan of DC link capacitors, and selectively generate an alert via fault alert system 62.

Figure 4:
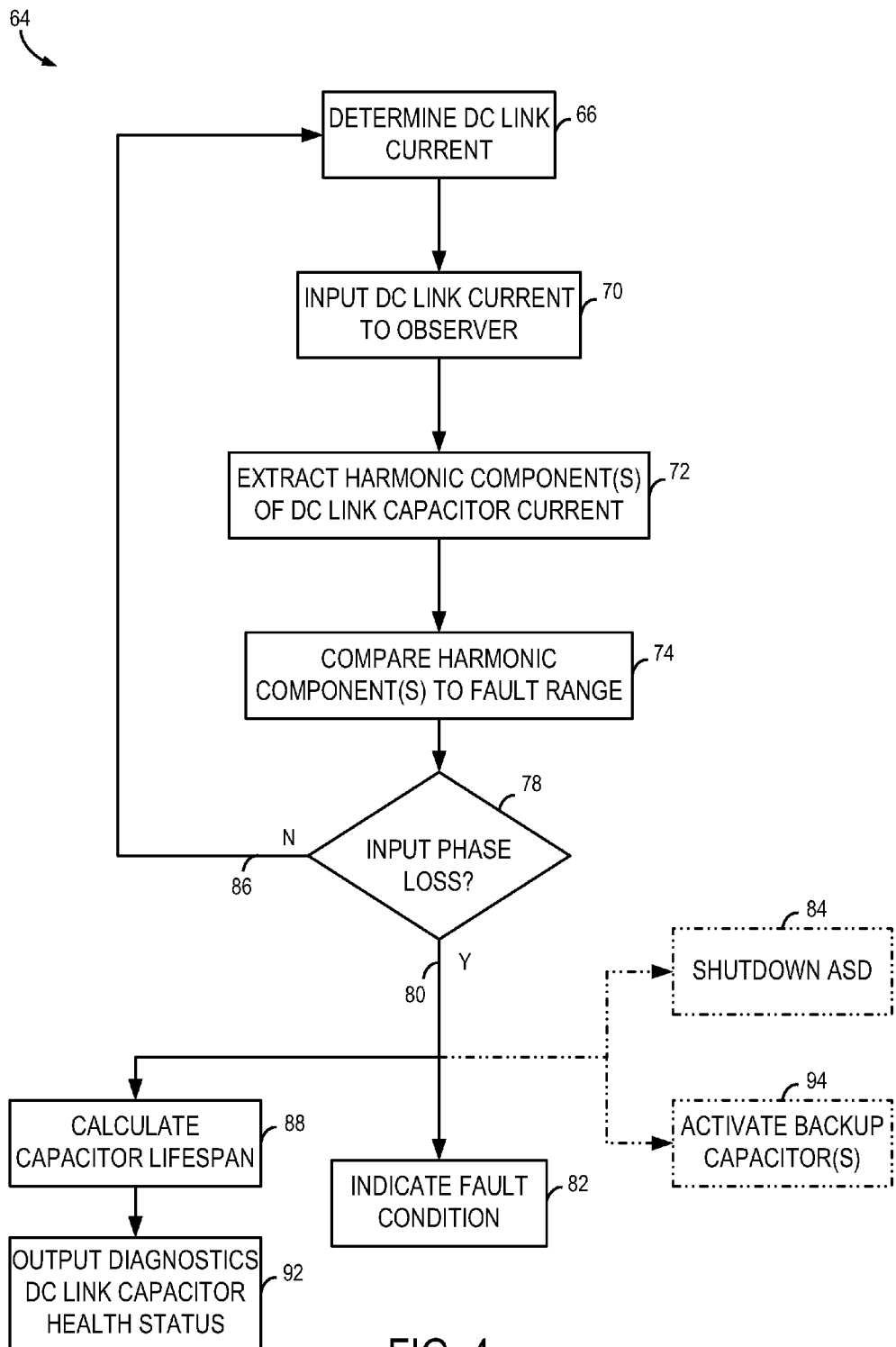
FIG. 4 is a technique for detecting an input phase loss to an adjustable speed drive and calculating a DC link capacitor lifespan according to an embodiment of the invention.

Referring now to FIG. 4, and with continued reference to FIG. 3, a technique 64 for detecting a utility input phase loss is set forth. Technique 64 begins at block 66, where the DC link current from ASD 12 is determined. According to one embodiment, the DC link current is calculated from voltage and current signals that are measured via one or more optional sensors 68 (shown in phantom), which may be included as a standard component on ASD 12. According to another embodiment, the DC link current is directly measured from an optional shunt resistor arrangement 20 (shown in phantom), which includes a shunt sensor 26 (FIG. 1) that may be included as a standard feature on ASD 12 or installed as an option on ASD 12. Referring back to FIGS. 3 and 4, at block 70 the DC link current is input to observer system 48.

At block 72, observer system 48 uses the DC link current received from ASD 12 to estimate the internal state of the state space model $\hat{x}$ and extract the harmonic components of the DC link capacitor current through determination of the values of variables of the state vector x, as described above with respect to FIG. 2.

At block 74, the extracted DC link capacitor harmonic current components are input to state feedback controller 60, which is programmed to determine whether a phase loss has occurred based on the extracted harmonic components. In particular, controller 60 includes a comparator 76 that compares at least one harmonic of the DC link capacitor current to a predetermined fault range to determine whether an input phase loss has occurred 78.

As set forth above, if a utility input phase loss occurs, the amplitude or peak current value of the sixth harmonic component of the DC link capacitor current will decrease. The presence of an input utility phase loss will also induce a second harmonic component of the DC link capacitor current. Thus, in one embodiment, comparator 76 is programmed to compare the amplitude or peak current value of the second harmonic component of the DC link capacitor current, $i_2$, as determined by the observer system 48, to a first portion of the predefined fault range. The first portion of the fault range is defined as including values above a first threshold. According to various embodiments, the first threshold may be defined as a current amplitude or peak current value indicative of a phase loss or may be a relatively scaled or per unitized threshold.

In one embodiment, comparator 76 compares the extracted amplitude or peak current value of second harmonic component to the first threshold. If the amplitude of $i_2$ is above the first threshold and thus falls within the first portion of the fault range 80, state feedback controller 60 is caused to indicate a fault condition at block 82. In an alternative embodiment, controller 60 is programmed to calculate a ratio of the amplitude or peak current value of the extracted second harmonic component to a constant, such as, for example, the rated RMS current of ASD 12. Comparator 76 then compares the calculated ratio to the first threshold to determine if the ratio falls within the first portion of the fault range. If comparator 76 determines that the calculated ratio is within the first portion of the fault range, state feedback controller 60 is caused to indicate a fault condition at block 82. As one example, if the calculated ratio is greater than 10 percent for a 40 hp, 460V, 60 Hz power level, state feedback controller 60 may be caused to indicate a fault condition.

Alternatively or in addition thereto, comparator 76 may be programmed to compare the amplitude of the sixth harmonic component of the DC link capacitor current, $i_6$, as determined by the observer system 48, to a second portion of the predefined fault range, which is defined as including values below a second threshold. According to various embodiments, the second threshold may be defined as a current amplitude or peak current value indicative of a phase loss or may be a relatively scaled or per unitized threshold.

In one embodiment, comparator 76 compares the extracted amplitude or peak current value of the sixth harmonic component to the second threshold. If the amplitude of $i_6$ is below the second threshold and thus falls within the second portion of the predefined fault range 80, state feedback controller 60 is caused to indicate a fault condition at block 82. Alternatively, controller 60 is programmed to calculate a ratio of the amplitude or peak current value of the extracted sixth harmonic component to a constant in a similar manner as described above with respect to the comparison of the second harmonic component. If the calculated ratio of the extracted sixth harmonic component to the constant falls within the second portion of the predefined fault range 80, state feedback controller 60 is caused to indicate a fault condition at block 82. As an example, if the calculated ratio is less than 45 percent for a 40 hp, 460V, 60 Hz power level, state feedback controller 60 may be caused to indicate a fault condition.

One skilled in the art will recognize that the presence of an input phase loss may be indicated as a fault condition in a number of ways. For example, the fault condition may be displayed as a visual alert on an operating panel (not shown) of the ASD. Alternatively, the fault condition may be indicated to an operator via an audible alarm. Further, if a phase loss is detected 80, technique 64 may include the optional step of shutting down the ASD at block 84 (shown in phantom). If an input phase loss is not detected 86, technique 64 returns to block 66 and continues cycling through blocks 66-74 to detect an input phase loss 78.

At block 88, technique 64 calculates the lifespan of the DC link capacitor based on the extracted DC link capacitor current, which was determined at block 72. In one embodiment, controller 60 is programmed with a DC link capacitor lifetime calculator 90 to calculate the DC link capacitor lifespan. The predicted capacitor lifespan is calculated by initially determining the total capacitor power loss, $P_{loss}$, according to:

$$P_{loss} = \sum_{n=1}^{N_h} I_{cap,n}^2 \cdot ESR(f_n), \quad \text{(Eqn. 10)}$$

where:

$I_{cap}$ is determined based on the harmonic components of the DC link capacitor current determined from the observer system, and $ESR(f_n)$ is the value of the equivalent series resistance at a particular frequency $f_n$.

The capacitor hot spot temperature, $T_h$, [° C.] and lifespan, $L_{op}$, [hours] are calculated as follows:

$$T_h = T_a + P_{loss} \cdot R_{th}, \quad \text{(Eqn. 11)}$$

$$L_{op} = A \cdot 2^{\frac{85-T_h}{c}}, \quad \text{(Eqn. 12)}$$

where:

$T_a$ is the capacitor ambient temperature, and $R_{th}$ is the capacitor thermal resistance.

The coefficients of A and c are known values based on the type of capacitors used in the ASD. At block 92 technique 64 outputs diagnostics indicating the DC link capacitor health status based on the calculated lifespan of the DC link capacitor.

Technique 64 may also include the optional step of adding or activating one or more "backup" DC link capacitors at optional block 94 (shown in phantom) based on the lifespan of the DC link capacitor calculated at block 88 and/or on the detection of an input phase loss 80. As described with respect to FIG. 1, DC link capacitor bank 32 of ASD 12 optionally includes one or more "backup" DC link capacitors 36 (shown in phantom) that are positioned in parallel with DC link capacitors 34. According to various embodiments, backup capacitors 36 may be manually added to ASD 12 upon the detection of an input phase loss or may be permanent components of ASD 12 that are configured such that they may be selectively activated upon the detection of an input phase loss.

As described in detail above, embodiments of the invention may be applied to motor assemblies that include an AC motor fed by a fixed or variable frequency supply. Also, the technique may be embodied in an internal module that receives a single-phase current signal or in a stand-alone external module configured to receive any combination of single-phase, three-phase, or multi-phase voltage and current signals. Further, while several embodiments of the invention are described with respect to an AC motor and AC motor drive, it is contemplated that the technique set forth herein may be applied to a wide variety of load type applications, including fixed and variable voltage applications.

The above-described methods can be embodied in the form of computer program code containing instructions embodied in one or more tangible computer readable storage media, such as floppy diskettes and other magnetic storage media, CD ROMs and other optical storage media, flash memory and other solid-state storage devices, hard drives, or any other computer-readable storage medium, wherein, when the computer program code is loaded into and executed by a computer, the computer becomes an apparatus for practicing the disclosed method. The above-described methods can also be embodied in the form of a generically termed "controller" configured to detect input phase loss and diagnose DC link capacitor health that utilizes an existing processor of ASD 12 shown in the various embodiments of FIGS. 1-4.

A technical contribution for the disclosed method and apparatus is that it provides for a controller implemented technique for detecting an input phase loss to an adjustable speed drive and for calculating the lifespan of the DC link capacitor.

Therefore, according to one embodiment of the present invention, a system for detecting input phase loss in an ASD includes an input unit to detect operating data from the ASD, wherein the operating data comprises a DC link current of the ASD and a state observer adapted to receive the operating data from the input unit and extract a DC link capacitor current of the ASD using the DC link current. The system also includes a controller programmed to compare the extracted DC link capacitor current to a predetermined fault range and generate a fault indication of an input phase loss if the extracted DC link capacitor current is within the predefined fault range.

According to another embodiment of the present invention, a method for detecting a phase loss in an adjustable speed AC drive includes identifying a DC link current of the adjustable speed AC drive and providing a state observer having a state space model representation of the adjustable speed AC drive. The method also includes inputting the identified DC link current into the state observer and extracting a DC link capacitor current of the adjustable speed AC drive using the state observer. Further, the method includes comparing at least one component of the DC link capacitor current to a predefined fault range and outputting a phase loss indicator if the at least one component of the DC link capacitor current is within the predefined fault range.

According to yet another embodiment of the present invention, a non-transitory computer readable storage medium has stored thereon a computer program comprising instructions which, when executed by at least one processor, cause the at least one processor to acquire a DC link current of an ASD and transmit the DC link current to a state observer formulated to represent the ASD. The instructions further cause the at least one processor to extract at least one component of a DC link capacitor current of the ASD from the state observer using the DC link current, wherein extracting the at least one component comprises extracting at least one of a second harmonic component of the DC link capacitor current and a sixth harmonic component of the DC link capacitor current. The instructions also cause the at least one processor to compare the amplitude of the at least one extracted component of the DC link capacitor current to a fault range. If the amplitude of the at least one extracted component of the DC link capacitor current is within the fault range, the instructions cause the at least one processor to generate an indication of a phase loss.

The present invention has been described in terms of preferred embodiments, and it is recognized that equivalents, alternatives, and modifications, aside from those expressly stated, are possible and within the scope of the appending claims.

What is claimed is:

1. A system for detecting input phase loss in an adjustable speed drive (ASD) comprising:
    an input unit to detect operating data from the ASD, wherein the operating data comprises a DC link current of the ASD;
    a state observer adapted to receive the operating data from the input unit and extract a DC link capacitor current of the ASD using the DC link current; and
    a controller programmed to:
        compare the extracted DC link capacitor current to a predetermined fault range; and
        generate a fault indication of an input phase loss if the extracted DC link capacitor current is within the predefined fault range.

2. The system of claim 1 wherein the state observer is further adapted to extract at least one harmonic component of the DC link capacitor current; and
    wherein the controller is further programmed to:
        compare the at least one harmonic component to the predefined fault range; and
        generate the fault indication based on the comparison.

3. The system of claim 2 wherein the controller is further programmed to:
    compare at least one of an amplitude of a second harmonic component of the DC link capacitor current and an amplitude of a sixth harmonic component of the DC link capacitor current to the predefined fault range; and
    generate the fault indication if at least one of the amplitude of the second harmonic component and the amplitude of the sixth harmonic component is within the predefined fault range.

4. The system of claim 1 wherein the input unit comprises:
    a sensor configured to measure current of a shunt resistor of the ASD; and
    a processor programmed to calculate the DC link current using the measured current.

5. The system of claim 1 wherein the input unit comprises at least one of a voltage sensor and a current sensor coupled to the ASD; and
    wherein the input unit is configured to determine the DC link current based on signals from at least one of the voltage sensor and the current sensor.

6. The system of claim 1 further comprising a fault alert system configured to issue at least one of an audible warning and a visual warning if the fault indication is generated.

7. The system of claim 1 wherein the controller is further programmed to shutdown the ASD if the fault indication is generated.

8. The system of claim 1 further comprising:
    at least one backup DC link capacitor positioned within the ASD such that the at least one backup DC link capacitor is selectively operable in parallel with the DC link capacitor; and
    wherein the controller is further programmed to activate the at least one backup DC link capacitor such that the at least one backup DC link capacitor operates in parallel with the DC link capacitor if the fault indication is generated.

9. The system of claim 1 wherein the controller is further programmed to:
    calculate an estimated lifespan of the DC link capacitor based on the estimated DC link capacitor current; and
    output the estimated lifespan to an operator.

10. The system of claim 9 wherein the processor is configured to calculate the estimated lifespan of the DC link capacitor using a capacitor power loss, a capacitor hot spot temperature, a capacitor ambient temperature, and a capacitor thermal resistance.

11. A method for detecting a phase loss in an adjustable speed AC drive comprising:
    identifying a DC link current of the adjustable speed AC drive;
    providing a state observer having a state space model representation of the adjustable speed AC drive;
    inputting the identified DC link current into the state observer;
    extracting a DC link capacitor current of the adjustable speed AC drive using the state observer;
    comparing at least one component of the DC link capacitor current to a predefined fault range; and
    outputting a phase loss indicator if the at least one component of the DC link capacitor current is within the predefined fault range.

12. The method of claim 11 wherein identifying the DC link current comprises one of:
    determining the DC link current based on signals received from at least one of a voltage sensor and a current sensor operatively coupled to the adjustable speed AC drive; and
    measuring current of a shunt resistor of the adjustable speed AC drive using a shunt sensor operatively coupled to the adjustable speed AC drive.

13. The method of claim 11 further comprising:
    comparing a second harmonic component of the DC link capacitor current to the predetermined fault range; and
    outputting the phase loss indicator if the second harmonic component of the DC link capacitor current is within the predefined fault range.

14. The method of claim 11 further comprising:
comparing a sixth harmonic component of the DC link capacitor current to the predetermined fault range; and
outputting the phase loss indicator if the sixth harmonic component of the DC link capacitor current is within the predefined fault range.

15. The method of claim 11 further comprising calculating an estimated lifespan of the DC link capacitor using the extracted DC link capacitor current.

16. The method of claim 11 wherein outputting the phase loss indicator further comprises generating at least one of an audible alarm and a visual alarm.

17. A non-transitory computer readable storage medium having stored thereon a computer program comprising instructions which, when executed by at least one processor, cause the at least one processor to:
acquire a DC link current of an adjustable speed drive (ASD);
transmit the DC link current to a state observer formulated to represent the ASD;
extract at least one component of a DC link capacitor current of the ASD from the state observer using the DC link current, wherein extracting the at least one component comprises extracting at least one of a second harmonic component of the DC link capacitor current and a sixth harmonic component of the DC link capacitor current;
compare the amplitude of the at least one extracted component of the DC link capacitor current to a fault range; and
if the amplitude of the at least one extracted component of the DC link capacitor current is within the fault range, generate an indication of a phase loss.

18. The computer readable storage medium of claim 17 wherein the instructions further cause the at least one processor to calculate a predicted lifespan of a DC link capacitor using the at least one extracted component of the DC link capacitor current.

19. The computer readable storage medium of claim 17 wherein the instructions further cause the at least one processor to shutdown the ASD if the amplitude of the at least one extracted component of the DC link capacitor current is within the fault range.

20. The computer readable storage medium of claim 17 wherein the instructions further cause the at least one processor to activate at least one backup DC link capacitor if the amplitude of the at least one extracted component of the DC link capacitor current is within the fault range.

\* \* \* \* \*